United States Patent [19]

Spenke et al.

[11] Patent Number: 4,884,114

[45] Date of Patent: Nov. 28, 1989

[54] DISCONNECTABLE THYRISTOR

[75] Inventors: Eberhard Spenke, Pretzfeld; Michael Stoisiek, Ottobrunn, both of Fed. Rep. of Germany

[73] Assignee: Siemens Aktiengesellschaft, Berlin and Munich, Fed. Rep. of Germany

[21] Appl. No.: 515,175

[22] Filed: Jul. 19, 1983

[30] Foreign Application Priority Data

Aug. 18, 1982 [DE] Fed. Rep. of Germany ....... 3230760

[51] Int. Cl.⁴ .......................................... H01L 29/74
[52] U.S. Cl. ..................................... 357/38; 307/633
[58] Field of Search ..................... 357/38; 307/252 C

[56] References Cited

U.S. PATENT DOCUMENTS

| | | | |
|---|---|---|---|
| 3,343,104 | 9/1967 | Motto, Jr. | 307/252 C |
| 4,298,809 | 11/1981 | Onda et al. | 307/252 C |
| 4,352,028 | 9/1982 | Voss | 307/252 C |
| 4,454,527 | 6/1984 | Patalong | 357/38 |

FOREIGN PATENT DOCUMENTS 2825794 12/1979 Fed. Rep. of Germany ... 357/38 G
2945324 5/1981 Fed. Rep. of Germany .

Primary Examiner—Andrew J. James
Assistant Examiner—Mark Prenty
Attorney, Agent, or Firm—Hill, Van Santen, Steadman & Simpson

[57] ABSTRACT

A thyristor has a semiconductor member with a pnpn-layer sequence, a plurality of n(p)-emitter parts, and switching transistors arranged at the edges of the n(p)-emitter parts. The switching transistors respectively include a p(n) semiconductor zone inserted in one of the n(p)-emitter parts, a partial zone of the p(n)-base, and an intermediately disposed channel zone covered by an insulated gate. Rapid and effective reduction of the electron-hole plasma flooding the p-base and n-base during quenching of the thyristor is achieved by a current source connected between electrodes for the p(n) semiconductor zones and a cathode (anode) feed line, the current source delivering an extraction current pulse.

9 Claims, No Drawings

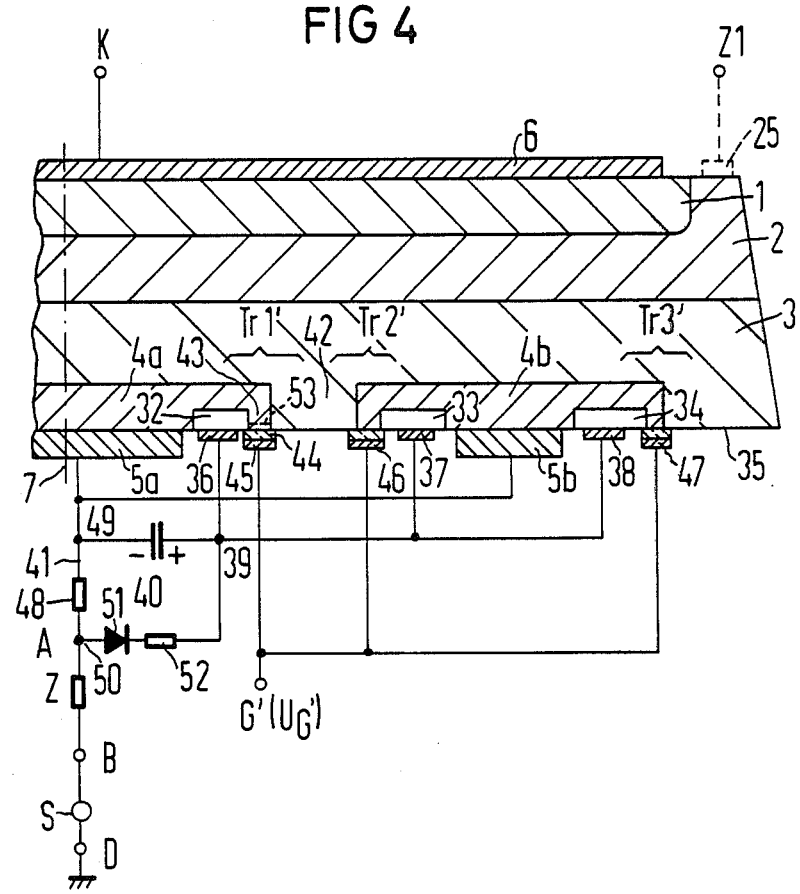

DISCONNECTABLE THYRISTOR

BACKGROUND OF THE INVENTION

1. Field of the Invention

The present invention relates to a disconnectable thyristor and in particular to such a thyristor having a pnpn-layer sequence with a plurality of emitter parts and switching transistors disposed at the edges of the emitter parts.

2. Description of the Prior Art

In the field of power semiconductor devices it is known to quench a thyristor by subjecting the p-base, through an electrode, with a negative extraction current pulse generated by an external extraction current source. The negative extraction current pulse reduces the positive holes of the electron-hole plasma flooding the p-base and the n-base. Electrons of the plasma are then no longer compensated in a space-charge fashion, and must flow off to the anode of the thyristor. The plasma is initially decomposed in the vicinity of the electrode by means of which the current pulse is supplied, the plasma decomposition subsequently spreading to regions farther from the electrode beneath the n-emitter.

A disadvantage of such conventional quenching means is that the load current flowing through the thyristor, because of the relatively gradual reduction of the plasma, is initially only slightly decreased, with the result that the carrier density in the plasma is actually initially increased, counter to the desired result, i.e., extraction of the plasma. Therefore a sufficiently large extraction current pulse is required which may be, for example, up to 50 ampers in the case of a load current of 100 ampers. If the amplitude of the extraction current pulse necessary for plasma extraction is not attained, extraction of the plasma proceeds to a certain point and then remains at a standstill. The thyristor must then conduct a load current, which has not been significantly decreased, with the partially-extracted plasma, which may as a consequence destroy the thyristor.

A thyristor having controllable emitter-base short circuits which are actively connected for quenching the thyristor is described in German AS 2,945,324. This device does not, however, utilize an external extraction current source connected for the purpose of quenching the thyristor.

SUMMARY OF THE INVENTION

It is an object of the present invention to provide a disconnectable thyristor having an external extraction current source connectable thereto for rapid and effective reduction of the electron-hole plasma.

The above object is inventively achieved in a thyristor having a semiconductor member with a pnpn-layer sequence, a plurality of n-emitter parts (or p-emitter parts) and switching transistors disposed at the edges of the respective emitter parts, each switching transistor consisting of a p or n semiconductor zone inserted in an emitter part of opposite conductivity, a partial zone of the p-base or n-base, and an intermediately disposed channel zone covered by an insulated gate. Extraction of the electron-hole plasma flooding the p-base and n-base during quenching of the thyristor is achieved by a current source connected between an electrode for the p semiconductor zone (or the n semiconductor zone) and the cathode (or anode) feed line, the current source supplying an extraction current pulse.

At least one advantage achieved with the structure disclosed and claimed herein is that the extraction current pulse, generated by the extraction current source, is simultaneously supplied to the thyristor base at a number of locations distributed over the thyristor area through switching transistors which are integrated at the boundary zones of the individual emitter parts inserted in the thyristor base. The extraction current pulse simultaneously supplied to various locations over the thyristor area causes simultaneous extraction operations on the electron-hole plasma beneath the individual emitter parts to occur, so that a largely homogenous progression of the disconnection operation is achieved over the entire thyristor area. The switching transistors are in the form of metal-insulator-semiconductor (MIS) field effect transistors integrated in the boundary zones of the emitter parts such that a portion of the emitter surface of the thyristor is shared by the thyristor and the respective transistors.

The external current source for supplying the extraction current pulse may be in the form of a capacitor connected to an additional current source which achieves the advantage that the capacitor, during the conducting state of the thyristor, can be charged with a relatively low current.

In a further embodiment of the invention the current source may be a capacitor connected between the emitter electrode of the switching transistor and the thyristor-side terminal of a resistance which is connected in the cathode feed line (or anode feed line), in which case charging of the capacitor proceeds automatically from the load current.

DESCRIPTION OF THE DRAWINGS

FIG. 4 is a sectional view of a second embodiment of a portion of a thyristor constructed in accordance with the principles of the present invention.

DESCRIPTION OF THE PREFERRED EMBODIMENTS

Figure 1:
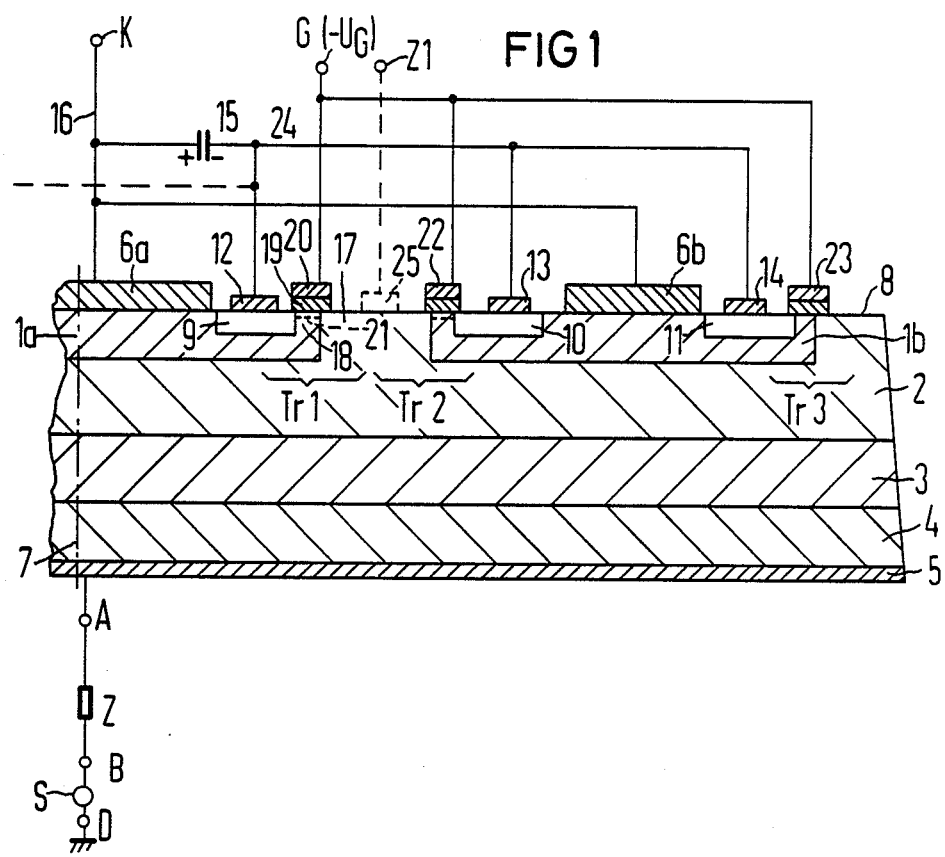
FIG. 1 is a sectional view of a portion of a thyristor constructed in accordance with the principles of the present invention.

A portion of a thyristor constructed in accordance with the principles of the present invention is shown in FIG. 1. The thyristor has a semiconductor member consisting of doped semiconductor material such as, for example, silicon, having four successive layers of alternating conductivity types. An n-conductive layer consisting of sections 1a and 1b is the n-emitter, a p-conductive layer 2 is the p-base, an n-conductive layer 3 is the n-base, and a p-conductive layer 4 is the p-emitter. The p-emitter 4 has an anode-side electrode 5 of electrically conductive material such as, for example, aluminum, having a terminal A. The sections of the n-emitter are respectively connected to cathode-side electrodes 6a and 6b of electrically conductive material such as, for example, aluminum, those electrodes being supplied with a terminal K.

Disregarding the sections 1a and 1b, the semiconductor member shown in FIG. 1 is in the shape of a flat disk which is rotationally symmetrical relative to an axis 7. The sections 1a and 1b are strip-shaped sections of the n-emitter which are inserted in the semiconductor member, each of those sections extending perpendicularly relative to the plane of the drawing essentially over the entire boundary surface 8 of the semiconductor member. The sections 1a and 1b are symmetrical to a plane containing the axis 7, which is disposed perpendicularly to the drawing plane. Thus, for example, an additional emitter section corresponding to the section 1b is disposed symmetrically with respect to the illustrated section 1b in a non-illustrated portion of the semiconductor member. As described above, each of sections 1a and 1b (and the corresponding non-illustrated symmetric sections) is connected to a cathode-side electrode 6a or 6b, those electrodes each being electrically connected to the terminal K.

The device has a terminal A which is connected through a load resistance Z to a first terminal B of a voltage source S which delivers a voltage of, for example +1000 volts. The load resistance Z may have a value of, for example, 10 ohms. The second terminal D of the voltage source S is connected to ground as well as to terminal K.

Island p-conductive semiconductor zones 9, 10 and 11 are inserted in the sections 1a and 1b of the n-emitter, those semiconductor zones extending to the boundary surface 8 and being in electrical connection with respective electrodes 12, 13 and 14. The electrodes 12, 13 and 14 are connected to a circuit node 24 which is connected through a current source 15 to a cathode feed line 16. The semiconductor zone 9, a partial zone 17 of the p-base 1, and a boundary zone 18 of the n-emitter section 1a (which is a channel zone and is covered by a gate 20 separated from the boundary surface 8 by a thin electrically insulating layer 19) form an MIS field effect switching transistor Tr1 which is controllable by a terminal G of the gate 20. The switching transistor Tr1, in a first switching state, connects the p-base 2 with the electrode 12 through a low-impedance path. Assuming that the structure consisting of the semiconductor zone 9, the partial zone 17, the boundary zone 18, the insulating layer 19 and the gate 20 represents a field effect transistor of the enhancement type, a negative control voltage $-U_G$ must be supplied to the terminal G in order to develop a p-conductive inversion channel 21 beneath the gate 20 on the boundary surface 8 forming the low-impedance path. In a second switching state of the transistor Tr1, that is, when the control voltage $-U_G$ is disconnected, the low-impedance path is interrupted.

Additional switching transistors Tr2 and Tr3 are provided on the boundary surface 8 formed in part by the respective p-conductive semiconductor zones 10 and 11, inserted in section 1b of the n-emitter and having respective gates 22 and 23 connected to the terminal G. The transistor Tr2, depending upon its switching state, establishes a low-impedance path between the p-base 2 and the electrode 13; the transistor Tr3 establishes such a path between the p-base 2 and the electrode 14. In addition, the non-illustrated portion of the thyristor is provided with switching transistors arranged symmetrically to transistors Tr1, Tr2 and Tr3 in relation to the plane containing the axis 7. Those non-illustrated transistors are controlled in common with the illustrated transistors via the terminal G. The respective electrodes of the non-illustrated transistors are connected in parallel with the electrodes 12, 13 and 14 at the circuit node 24, as indicated by the dashed line.

The thyristor is switched to a conducting state with an applied voltage U. Such switching may be undertaken, for example, by means of a positive trigger pulse supplied to a terminal Z1 of a trigger electrode 25 in contact with the p-base 2, causing the p-base 2 and n-base 3 to be flooded with an electron-hole plasma. The triggering means does not form a part of the inventive concept disclosed and claimed herein and is indicated in dashed lines in FIG. 1.

In order to quench the thyristor, a negative control voltage $-U_G$ which may be, for example, a voltage pulse, is supplied to the terminal G. This causes inversion channels, such as the channel 21 shown beneath the gate 20, to arise beneath each of the gates 20, 22 and 23 (and the non-illustrated gates) which form respective low-impedance paths between the electrodes 12, 13 and 14 and the p-base 2. A negative extraction current pulse is supplied from the current source 15 through the switching transistors Tr1, Tr2 and Tr3 (and the non-illustrated switching transistors) to the partial zones of the p-base 2, such as zone 17. The partial zones respectively border the individual emitter parts such as, for example, section 1a.

The extraction current pulse causes a reduction in the holes of the electron-hole plasma in the p-base 2 and the n-base 3. The negative electrons of the plasma, which are no longer compensated in a space-charge fashion, migrate toward the anode-side electrode 5. This causes the plasma to deteriorate in the region of the partial zones of the p-base 2, such as zone 17, disposed adjacent to the n-emitter parts, such as sections 1a and 1b. The current source 15 supplies a current pulse of such a magnitude that the free charge carriers forming the plasma are extracted from the thyristor within several microseconds.

Figure 2:
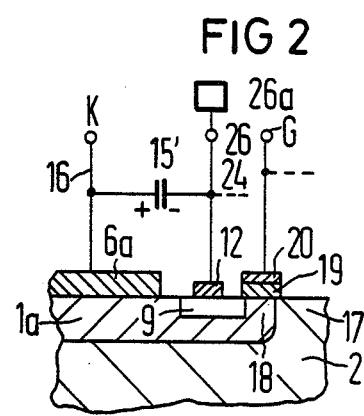
FIG. 2 is a sectional and schematic view of an embodiment for the current source for use with the thyristor shown in FIG. 1.

Another embodiment for the current source 15 is shown in FIG. 2 in the form of a capacitor 15' having an electrode-side terminal connected to a further current source 26a at 26. The current source 26a charges the capacitor 15', after an extraction current pulse has been supplied to the thyristor, to the original voltage with the indicated polarity. Because in practical operation relatively long time intervals exist between successive extraction current pulses, during which intervals the thyristor is operated in a conducting state, it is possible to charge the capacitor 15 by means of the current source 26a with relatively low current. Surrounding circuit elements corresponding to those described in connection with those in FIG. 1 are also shown in FIG. 2 identified with the same reference symbols.

Figure 3:
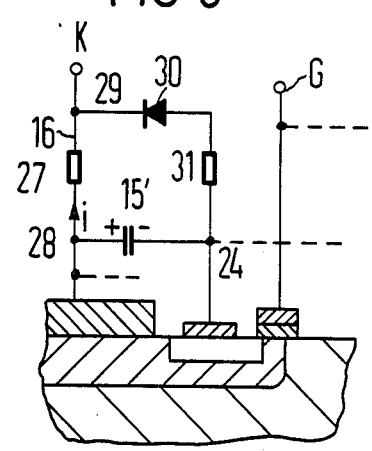
FIG. 3 is a sectional and schematic view of a further embodiment for a current source for use with the thyristor shown in FIG. 1.

Another embodiment for a current source for use with the thyristor shown in FIG. 1 is illustrated in FIG. 3, wherein the current source 26a of FIG. 2 is replaced by other components. An ohmic resistance 27 is interconnected in the cathode feed line 16, the resistance 27 having a thyristor-side terminal 28 connected to the capacitor 15'. A second terminal 29 of the resistance 27 is connected to the cathode of a rectifier 30, the rectifier 30 having an anode connected through a current limiting resistance 31 to the circuit node 24. In this embodiment, a load current i flows while the thyristor is conducting causing a voltage drop across the resistance 27 which permits the rectifier 30 to charge the capacitor 15 with the illustrated polarity. The remaining surround circuit elements correspond to those already identified in connection with FIG. 1 and FIG. 2, and are identically referenced.

Another embodiment for a thyristor constructed in accordance with the principles of the present invention is shown in FIG. 4 having an n-emitter layer 1, a p-base layer 2, an n-base 3, and a p-emitter consisting of individual emitter parts such as sections 4a and 4b. The emitter parts 4a and 4b are respectively connected to sections 5a and 5b of the anode-side electrode. The anode-side electrode is electrically connected to the anode terminal A. The cathode 6 in contact with the n-emitter 1 is shown undivided for a better overview. Island n-conductive semiconductor zones 32, 33 and 34 are inserted in the p-emitter sections 4a and 4b which zones extend to the boundary surface 35 of the thyristor at which location the respective semiconductor zones 32, 33 and 34 are in electrical contact with electrodes 36, 37 and 38. The electrodes 36, 37 and 38 are connected to a circuit node 39, which is connected through a capacitor 40 with the anode feed line 41. The semiconductor zone 32, a partial zone 42 of the n-base 3, and the boundary zone of the p-emitter section 4a (which forms a channel zone and is covered by a gate 45 separated from the boundary surface 35 by a thin electrically insulating layer 44) form an MIS field effect switching transistor Tr1' which is controlled by a terminal G' of the gate 45. Additional switching transistors Tr2' and Tr3' are analagously constructed, being formed in part by n-semiconductor zones 33 and 34, and being respectively controllable through gates 46 and 47 connected to the terminal G'. An ohmic resistance 48 is interconnected in the anode feed line 41 having an anode-side terminal 49 connected to one terminal of the capacitor 40. The other terminal of the resistance 48, which coincides with the anode terminal A, is connected to the circuit node 39 through a rectifier 51 and a current limiting resistor 52 connected in series therewith. The capacitor 40 forms, in combination with the resistances 52 and 48 and the rectifier 51, a current source interconnected between the circuit nodes 39 and 49.

The thyristor shown in FIG. 4 is switched to a conducting state by means of, for example, a positive trigger current pulse supplied to the trigger electrode 25 via a terminal Z1. In order to quench the thyristor shown in FIG. 4, a positive control voltage $U_{G'}$ which may be, for example, a voltage pulse, is supplied to the terminal G'. As a consequence, inversion channels such as channel 53 shown beneath the gate 45, begin to form beneath the illustrated gates 45, 46 and 47 (and the non-illustrated gates symmetrically disposed with respect to the axis 7). These inversion channels form low-resistance paths between the respective electrodes 36, 37 and 38 and the n-base 3. A positive extraction current pulse is supplied from the capacitor 40 through the transistors Tr1', Tr2' and Tr3' (and corresponding symmetrical non-illustrated switching transistors) to the partial zones of the n-base, for example, partial zone 42. These partial zones respectively laterally border the sections 4a and 4b.

In a manner analogous to the effect achieved with the transistors Tr1, Tr2 and Tr3 in the embodiment of FIG. 1, deterioration of the electron-hole plasma in the p-base 2 and the n-base 3 results. For reliable quenching of thyristor the extraction current pulse supplied by the capacitor 40 must be sufficiently large such that the free charge carriers forming the plasma are extracted from the thyristor in a time interval of approximately several microseconds.

A further modification may be made to the embodiment shown in FIG. 4 by dividing the n-emitter 1 into several sections, such as sections 1a and 1b as shown in FIG. 1 with cathode-side controllable switching transistors such as transistors Tr1, Tr2 and Tr3 described in connection with FIG. 1 being provided as well. In this embodiment, the transistors Tr1 through Tr3 are activated at the terminal G (shown in FIG. 1) and the switching transistors Tr1' through Tr3' are activated terminal G', the former with a negative control voltage $-U_G$ and the latter with a positive control voltage $+U_{G'}$. The capacitor 40 in the embodiment shown in FIG. 4 may be connected at the circuit node 39 to an additional current source by means of which the capacitor 40 is charged with the indicated polarity during the conducting state of the thyristor. In such an embodiment, the rectifier 51, the current limiting resistor 52, and the ohmic resistance 48 in the anode feed line 41 are omitted.

The emitter sections 1a and 1b (and 4a and 4b) may be designed rotationally symmetric relative to the axis 7. In such an embodiment, the emitter section 1a (and 4a) will be in the form of a circle, whereas the section 1b (and 4b) will be in the form of a ring. The n-emitter may also be divided into a plurality of emitter sections analogous to sections 1a and 1b which are distributed over the boundary surface 8 of the thyristor rectiliniearly, annularly, or in any other manner known to those skilled in the art. The individual n-emitter parts may also be contiguous with one another to form an emitter layer having a plurality of recesses corresponding in size and location to the inversion channel 21 (or 53)---immediately following "recesses". Also in such an embodiment the MIS field effect switching transistors are disposed at the border-side relative to the emitter parts, that is, in the recesses.

Although modification and changes may be suggested by those skilled in the art it is the intention of the inventors to embody within the patent warranted hereon all changes and modifications as reasonably and properly come within the scope of their contribution to the art.

We claim as our invention:

1. In a thyristor having a triggering means and a semiconductor member having alternating layers of opposite conductivity type consisting in sequence of an emitter of a first conductivity type in contact with an electrode of a first polarity, a base of a second conductivity type, a base of said first conductivity type, with a pn-junction existing between said bases, and an emitter of said second conductivity type in contact with an electrode of a second opposite polarity, at least said emitter of said second conductivity type consisting of a plurality of distinct emitter sections each exhibiting a boundary surface, a means for quenching said thyristor comprising:

a plurality of switching transistors each consisting of a semiconductor zone of said first conductivity type inserted in one of said emitter sections of said second conductivity type, a partial zone of said base of said first conductivity type, an intermediate channel zone adjacent to said semiconductor zone in said emitter section, said channel zone being covered by an insulating layer at said boundary surface and a gate over said insulating layer, said gate connected to a control terminal; and a current source having poles respectively exhibiting said first and second polarities and being interconnected between each of said semiconductor zones and a feed line for said electrode of said second polarity, with a pole of said current source exhibiting said first polarity being connected to said feed line, whereby said thyristor in a conducting state is rapidly quenched upon the application of a control voltage of said second polarity to said control terminal.

2. A thyristor as claimed in claim 1 wherein said emitter of said first conductivity type consists of a plurality of distinct emitter sections.

3. A thyristor as claimed in claim 1 wherein said current source comprises:

a capacitor interconnected between said feed line and each of said semiconductor zones; and an additional low current source connected to a node between said capacitor and said semiconductor zones.

4. A thyristor as claimed in claim 1 wherein said current source comprises:

a resistance in said feed line having a resistance terminal connected to said electrode of said second polarity; and a capacitor interconnected between said resistance terminal and each of said semiconductor zones.

5. A thyristor as claimed in claim 4 wherein said current source further comprises a rectifier connected in parallel with said resistance and said capacitor.

6. A thyristor as claimed in claim 5 wherein said current source further comprises a current limiting resistance connected in series with said rectifier and in parallel with said feed line resistance and said capacitor.

7. A thyristor as claimed in claim 1 wherein said distinct emitter sections are physically separated from each other.

8. In a thyristor having a triggering means and a semiconductor member having alternating layers of opposite conductivity type consisting in sequence of a p-emitter in contact with an anode electrode, an n-base, a p-base, with a pn-junction existing between said bases, and an n-emitter in contact with a cathode electrode, said n-emitter consisting of a plurality of distinct n-emitter sections each exhibiting a boundary surface, a means for quenching thyristor comprising:

a plurality of switching transistors each consisting of a p-type semiconductor zone inserted in one of said n-emitter sections, a partial zone of said p-base, and an intermediate channel zone adjacent to said p-type zone in said n-emitter section, said channel being covered by an insulating layer at said boundary surface and a gate over said insulating layer, said gate connected to a control terminal; and a current source interconnected between each of said p-type semiconductor zones and a cathode feed line, said current source having a positive pole connected to said cathode feed line, whereby said thyristor in a conducting state is rapidly quenched upon the application of a negative control voltage to said control terminal.

9. A thyristor having a triggering means and a semiconductor member having alternating layers of opposite conductivity type consisting in sequence of an n-emitter in contact with a cathode electrode, a p-base, an n-base, with a pn-junction existing between said bases, and a p-emitter in contact with an anode electrode, at least said p-emitter consisting of a plurality of distinct p-emitter sections each exhibiting a boundary surface, a means for quenching said thyristor comprising:

a plurality of switching transistors each consisting of an n-type semiconductor zone inserted in one of said p-emitter sections, a partial zone of said n-base, and an intermediate channel zone adjacent to said n-type zone in said p-emitter section, said channel zone being covered by an insulating at said boundary surface and a gate over said insulating layer, said gate connected to a control terminal; and a current source interconnected between each of said n-type semiconductor zones and an anode feed line, said current source having a negative pole connected to said feed line, whereby said thyristor in a conducting state is quenched upon the application of a positive control voltage to said control terminal.

* * * * *